United States Patent [19]

Nagumo et al.

[11] Patent Number: 4,783,683
[45] Date of Patent: Nov. 8, 1988

[54] IMAGE RECORDING APPARATUS
[75] Inventors: Akihiko Nagumo; Minoru Ishikawa; Ken Kawada, all of Kanagawa, Japan
[73] Assignee: Fuji Photo Film Co., Ltd., Kanagawa, Japan
[21] Appl. No.: 32,678
[22] Filed: Apr. 1, 1987
[30] Foreign Application Priority Data Apr. 3, 1986 [JP] Japan .................................. 61-77197
Oct. 20, 1986 [JP] Japan ................................ 61-248972
Oct. 20, 1986 [JP] Japan ................................ 61-248973
Oct. 20, 1986 [JP] Japan ................................ 61-248975

[51] Int. Cl.$^4$ ........................ G03B 27/52; G03C 5/16
[52] U.S. Cl. ...................................... 355/27; 250/318; 250/319
[58] Field of Search ................... 355/27, 79; 358/303; 250/318, 319

[56] References Cited
U.S. PATENT DOCUMENTS

4,620,096 10/1986 Takehara et al. ............... 250/318 X
4,659,927 4/1987 Tago et al. ........................ 250/318

Primary Examiner—L. T. Hix
Assistant Examiner—D. Rutledge
Attorney, Agent, or Firm—Sughrue, Mion, Zinn, Macpeak & Seas

[57] ABSTRACT

An image recording apparatus employs a photo- and pressure-sensitive heat-developable material having a substrate and a layer formed on the substrate from a material which is photo-sensitive and heat-developable and which enables the developed image to be fixed by a pressure, and an image receiving material. The photosensitive material and the image receiving material being adapted to be superposed one on the other and pressed to each other so as to transfer the image from the photosensitive material to the image receiving material. The pressing of these two materials is conducted by a means which includes a pair of pressing rolls for nipping the photosensitive material and the image receiving material therebetween; back-up rolls means having an axial length smaller than that of the pressing rolls and adapted for acting on at least one of the pressing rolls; and back-up roll pressing means capable of independently adjusting the pressure exerted by the back-up roll means on the pressing rolls.

19 Claims, 7 Drawing Sheets

IMAGE RECORDING APPARATUS

BACKGROUND OF THE INVENTION

The present invention broadly relates to a pressurizing type image recording apparatus in which an image carried by a photo- and pressure-sensitive material is transferred to an image receiving material as the photosensitive material is superposed on and pressed to the image receiving material.

More particularly, the invention is concerned with an image recording apparatus which makes use of a photo- and pressure-sensitive material having a substrate and a layer of a substance on the substrate, the substance being photo-sensitive and, not exclusively, developable by application of heat, the substance further being capable of fixing the developed image by application of a pressure, the heat-developable material after exposure and development being superposed on and pressed to an image receiving material, whereby an image is received by the image receiving material.

An image recording material employing microcapsules containing a photosensitive composition is known. An example of such a recording material is disclosed in Japanese Patent Laid-open No. 179,836/1982. This recording material has a substrate which carries capsules made of a synthetic polymeric resin and containing a vinyl compound, a photopolymerization initiator and a coloring precursor.

In recording an image using this recording material, the material is first exposed so that the microcapsules are hardened in conformity with the form of the image. Then, as the recording material is pressed, the microcapsules which have not been hardened are ruptured so as to release the coloring agent precursor, thus forming a color image. This image recording system provides a high quality of the recorded image with a dry-type simple processing, but suffers from a disadvantage in that the photosensitivity is much smaller as compared with the system which makes use of silver halide.

Under this circumstance, the present applicant has proposed, in the specification of Japanese Patent Application No. 117089/1985, a novel recording material which has a high photosensitivity and which ensured a high quality of the recorded image with a simple dry-type process. This recording material is a photo- and pressure-sensitive heat-developable material constituted by a carrier and a layer formed on the surface of the carrier, the layer containing at least a photosensitive silver halide, reducing agent, polymerizable compound and a color image forming substance, wherein the polymerizable compound and the color image forming substance are confined in common microcapsules.

An image recording method which makes use of this photo- and pressure-sensitive heat-developable material is disclosed in the specification of Japanese Patent Application No. 121284/1985 filed by the same applicant. According to this method, the heat-developable material is first exposed so that a latent image is formed thereon in conformity with the image to be recorded. Then, the material is heated for development so that the polymerizable compound in the area where the latent image exists is polymerized to produce a polymeric compound, thus thermally setting the microcapsules. Then, the material is superposed on an image receiving material having an image receiving layer capable of receiving the color image forming substance, and is pressed to the image receiving material so that at least part of the microcapsules having no latent image is ruptured so as to transfer the color image forming substance to the image receiving material, thereby forming an image on the latter.

In order to obtain a clear image by the transfer of the heat-developed image from the photo- and pressure-sensitive heat-developable material to the image receiving material, it is essential that the heat-developable material be pressed uniformly onto the image receiving material under a given condition.

A pressure-fixing device used in the field of electrophotography is known as an apparatus which is capable of uniformly pressurizing a sheet material. This device is a compact device having a pair of pressurizing rolls which are pressed to each other such that their axes form a predetermined angle $\alpha$ therebetween, so that the sheet material which passes through the nip between these rollers can be uniformly pressed at a high pressure. This device, however, produces a problem when it is used for the pressure-transfer of the image from the heat-developable material to the image receiving material. Namely, when two sheets, i.e., the heat-developable material and the image receiving material, are made to pass through the nip between two pressurizing rollers, these two sheets are driven in different directions because these rollers are arranged at an inclination to each other, so that two sheets tend to be offset from each other with the result that the transferred image is distorted or the sheets are wrinkled.

Another problem encountered is that there has been proposed no image recording apparatus of the kind described which is capable of performing automatically a series of operations including exposure of the heat-developable material, superposition of the heat-developable material and image receiving sheet, transfer by pressurizing and formation of the image on the image receiving material, while ensuring economical supply of the heat-developable and image receiving materials and avoiding any jamming of the materials in the apparatus, with compact design of the apparatus having no substantial projection from the apparatus body.

Still another problem encountered by the prior art is that there has been proposed no image recording apparatus of the kind described which is capable of performing automatically a series of operations including exposure of the heat-developable material, superposition of the heat-developable material and image receiving sheet, transfer by pressurizing and formation of the image on the image receiving material, while enabling an easy administration of the photosensitive material and avoiding any winding or rolling tendency of the photosensitive material, thus assuring highly precise transfer of the image and, hence, a high quality of the recorded image.

Accordingly, a first object of the present invention is to provide an image recording apparatus of the type described, wherein the photo- and pressure-sensitive heat-developable material and the image receiving material, which are superposed one on the other, can be uniformly pressurized at a pressure which is easily adjustable, without being accompanied by problems such as distortion of the transferred image and wrinkling of both sheet materials.

To this end, according to one aspect of the present invention, there is provided an image recording apparatus which employs a photo- and pressure-sensitive heat-developable material having a substrate and a layer formed on the substrate from a material which is photosensitive and heat-developable and which enables the developed image to be fixed by a pressure, and an image receiving material, the heat-developable material and the image receiving material being adapted to be superposed one on the other and pressed to each other so as to transfer the image from the heat-developable material to the image receiving material, the apparatus comprising: a pair of pressing rolls for nipping the heat-developable material and the image receiving material therebetween; back-up rolls means having an axial length smaller than that of the pressing rolls and adapted for acting on at least one of the pressing rolls; and back-up roll pressing means capable of independently adjusting the pressure exerted by the back-up roll means on the pressing rolls.

A second object of the present invention is to provide a compact construction of image recording apparatus in which the portions such as those accommodating the heat-developable material and image receiving material do not project from the apparatus body, and in which the risk for the heat-developable material and the image receiving material to be jammed in the apparatus is minimized.

To this end, according to another aspect of the present invention, there is provided an image recording apparatus which employs a photosensitive material having a substrate and a layer formed on the substrate from a material which enables the developed image to be fixed by a pressure, and an image receiving material, the photosensitive material and the image receiving material being adapted to be superposed one on the other and pressed to each other so as to transfer the image from the photosensitive material to the image receiving material, the apparatus characterized in that the photosensitive material and the image receiving materials are supplied from rolls of the respective materials.

The term "photosensitive material" in this case is used to represent any material capable of transferring an exposure image to an image receiving material having an image receiving layer, by application of pressure. An example of such a material is the one which is disclosed in Japanese Patent Laid-open No. 179,836 mentioned before.

The photosensitive material may be of the type which is heat-developed or wet-developed in advance of the transfer by application of pressure. As an example of such a material, the specification of Japanese Patent Application No. 121,284 mentioned before discloses a material composed of a substrate and a layer formed on the substrate from at least a photosensitive silver halide, polymerizable compound and a color image forming substance, wherein at least the polymerizable compound and the color image forming material are charged in common capsules. When this material is used, the photosensitive material is exposed and the latent image formed by the silver halide is developed by heat-development simultaneously with the thermal setting of the polymerizable compound. Then, the pressure is applied to visualize the image.

A third object of the invention is to provide an image recording apparatus in which the photosensitive material is supplied in the form of separate sheets so that any tendency of fogging which tends to appear when the photosensitive material is rolled can be effectively suppressed and the construction of the device for supplying the photosensitive material is simplified.

It is also an object of the invention to provide an image recording apparatus in which the photosensitive material does not exhibit any winding or rolling tendency so as to suppress occurrence of jamming and to ensure a close contact with the image receiving material, thus assuring a high prevision of transfer and, hence, a high quality of the recorded image.

It is also an object of the invention to provide an image recording apparatus in which the photosensitive material is interchangeable for a variety of photosensitivity levels, sizes and other conditions.

It is also an object of the invention in which the image receiving material is supplied from a roll, so that the portions projecting from the body of the apparatus is decreased, thus allowing an easy handling of the apparatus.

To these ends, according to still another aspect of the present invention, there is provided an image recording apparatus which employs a photosensitive material having a substrate and a layer formed on the substrate from a material which enables the developed image to be fixed by a pressure, and an image receiving material, the photosensitive material and the image receiving material being adapted to be superposed one on the other and pressed to each other so as to transfer the image from the photosensitive material to the image receiving material, the apparatus characterized in that the photosensitive material is supplied in the form of separate sheets while the image receiving materials is supplied from a roll of the image receiving material.

A fourth object of the present invention is to provide an image recording apparatus in which the photosensitive material and the image receiving material are supplied by devices having simple constructions.

It is also an object of the present invention to provide an image recording apparatus in which the photosensitive material and the image receiving material fed to the apparatus do not have any rolling tendency so that they are superposed in close contact with each other thus assuring a high transfer precision and, hence, high quality of the recorded image.

It is also an object of the present invention to provide an image recording apparatus in which both the photosensitive material and the image receiving material are changeable for a variety of sensitivity levels, sizes and kinds of materials, e.g., ordinary image receiving paper or transparency sheet for overhead projectors.

To these ends, according to a further aspect of the invention, there is provided an image recording apparatus which employs a photosensitive material having a substrate and a layer formed on the substrate from a material which enables the developed image to be fixed by a pressure, and an image receiving material, the photosensitive material and the image receiving material being adapted to be superposed one on the other and pressed to each other so as to transfer the image from the photosensitive material to the image receiving material, the apparatus characterized in that the photosensitive material and the image receiving materials are supplied, respectively, in the form of separate sheets.

DESCRIPTION OF THE PREFERRED EMBODIMENTS

An image recording apparatus in accordance with the first embodiment will be described hereinunder.

Figure 1:
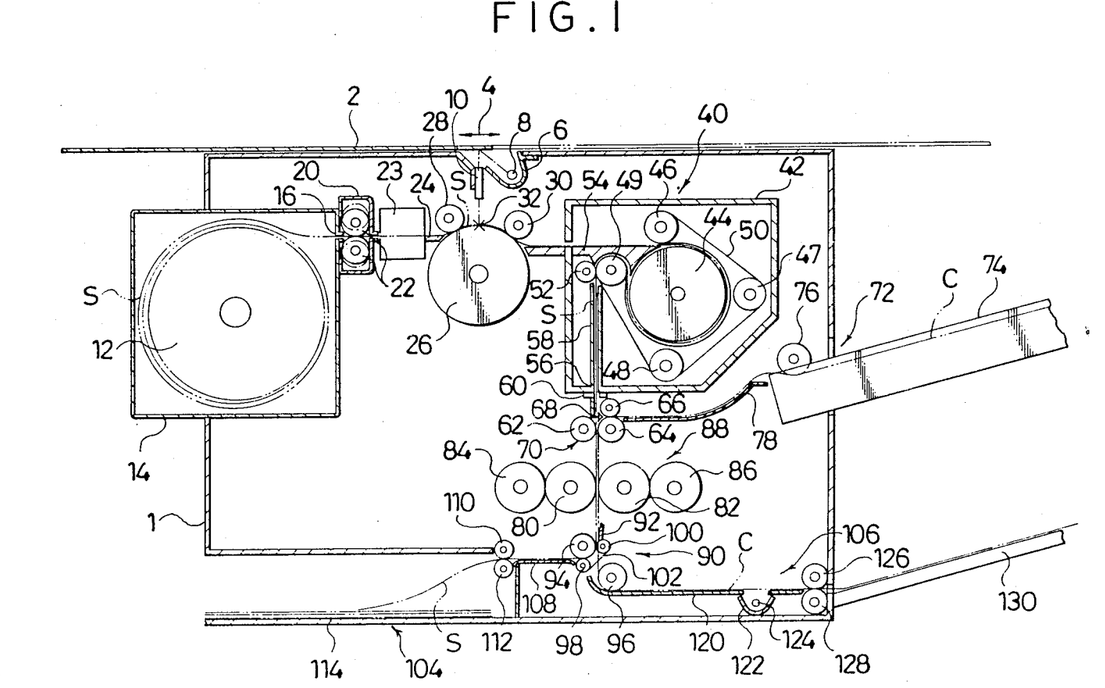
FIG. 1 is an illustration of an image recording device in accordance with the first embodiment of the present invention.

As shown in section in FIG. 1, the apparatus of the first embodiment has a housing 1 on the upper surface of which is disposed an original supporting glass plate 2 for reciprocating movement in the direction of an arrow 4. Namely, the glass plate 2 carries an original with its image side directed downwardly and moves between the position illustrated by full line and a position illustrated by an imaginary line.

An illuminating lamp 8 for illuminating an original is placed under the glass plate 2. A fiber lens array 10 is adapted for projecting the image on the original onto a photo- and pressure-sensitive heat-developable material S (referred to as "photosensitive material", hereinafter).

A cartridge 14 accommodating a photosensitive roll 12 on which is wound the photosensitive material S is detachably secured to one side of the housing 1. A pair of extraction rolls 22, 22, disposed at a photosensitive material outlet 16 in the catridge 14 is received in a dark box 20 connected to a magazine. These rolls 22, 22 are adapted for extracting a predetermined length of the photosensitive material S in a predetermined time. When approached by the leading end of the photosensitive material S, the extraction rolls 22, 22 are moved away from each other as indicated by imaginary lines so as not to impede the passage of the photosensitive material S. A cutter unit 23 for cutting the photosensitive material S, as well as a guide plate 24, are disposed downstream of the dark box 20 as viewed in the direction of movement of the photosensitive material S.

A supporting roll 26 for supporting exposed photosensitive material, as well as a pair of nip rolls 28, 30 pressed thereon, are disposed downstream of the guide plate 24. The photosensitive material S guided by the guide plate 24 is held in close contact with the supporting roller 26 by the nip rollers 28 and 30. The portion of the photosensitive material between these nip rolls 28 and 30 is exposed to the image on the original through the fiber lens array 10.

A heat-developing device 40 for heat-developing an image on the exposed photosensitive material S is disposed downstream of the supporting roll 26. The heat-developing device 40 has a heat-insulating developing housing 42, a heating roller 44 disposed in the housing 42 and adapted to be heated to about 120° C., an endless belt supported by four support rolls 46, 47, 48 and 49 and wound around the heating roll 44 through an angle of 270°, and a nip roll 52 pressed onto the support roll 49.

The developing device 40 further has a guide device 54 for guiding the photosensitive material S from the support roll 26 onto the heating roll 44 and for separating the photosensitive material S from the heating roll 44 after heat-development. The developing device 40 also has a vertical guide device 58 which guides the photosensitive material S after development and fed by the support roll 49 and the nip roll 52 towards an outlet 56. A sensor 60 for sensing the leading end of the photosensitive material is provided at the outlet 56.

A superposing device 70 is disposed immediately below the outlet 56. The superposing device includes a pair of pressing rolls 62, 64, a nip roll 66 pressed onto the pressing roll 64, and a guide member 68 which guides an image receiving sheet C fed by the pressing roll 64 and the nip roll 66 towards the nip between the pressing rolls 62 and 64.

An image receiving sheet supply device 72 is disposed at one side of the superposing device 70. The image receiving sheet supply device 72 includes an image receiving sheet supply cassette 74 detachably mounted on the housing 1 so as to project therefrom, an image receiving sheet supply roll 76 for extracting the image receiving sheet C from the cassette 74, and a guide plate 78 which guides the extracted image receiving sheet C towards the nip between the pressing roll 64 and the nip roll 66. The image receiving sheet C has a width about 6 mm smaller than that of the photosensitive material S. The superposing device 70 is adapted to superpose the image receiving sheet C and the photosensitive material S such that their longitudinal axes are aligned with each other, i.e., such that the image receiving sheet C is centralized with respect to the photosensitive material in the widthwise direction.

A pressurizing image forming device, i.e., a transfer device 88 is disposed below the superposing device 70. The transfer device 88 includes a pair of pressing rolls 80, 82, and a pair of back-up rolls 84, 86 for uniformalizing the contact pressure between the pressing rolls 80 and 82.

Figure 2:
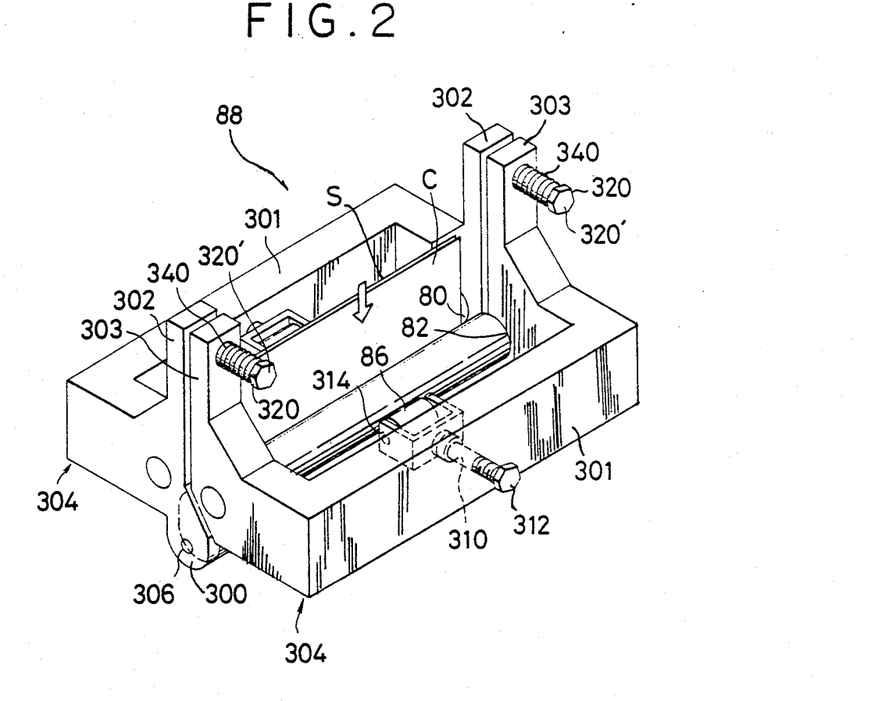
FIG. 2 is a perspective view of a transfer device.

As shown in FIG. 2, the transfer device 88 includes a pair of bases 304, 304 each having a substantially U-shaped configuration and provided at its both ends with a bearing portion 300 and an adjusting arm 302 which protrude perpendicularly to the plane including the U-shape. The bases 304 are pivotally connected to each other by a pin 306.

Figure 3:
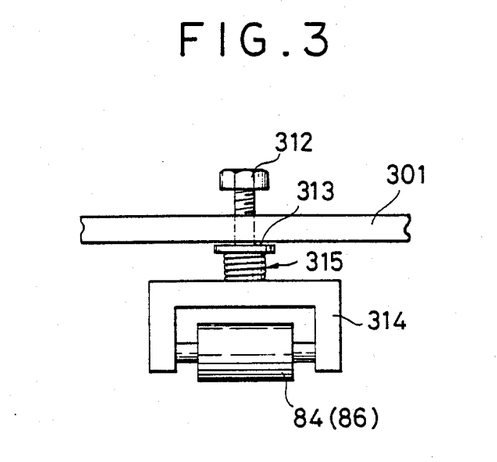
FIG. 3 is an enlarged illustration of a pressurizing mechanism employing a back-up roll.

The pressing rolls 80 and 82 are are mounted on the U-shaped portions in parallel with the axis of the pin 306. A female screw 310 is provided on the portion of the U-shaped portion extending in parallel with the axis of the pin 306. A back-up pressure adjusting screw 312 is screwed to this female screw 310. As shown in FIG. 3, a flange 313 contacting with a coiled spring 315 is provided on the end of the back-up pressure adjusting screw 312. The other end of the coiled spring 315 contacts a back-up roll support member 314. The portion of the back-up pressure adjusting screw 312 projecting beyond the flange 313 is provided with a hub (not shown) which projects into the coiled spring 315 so as to prevent the latter from moving laterally. A back-up roll 86 or 84 is supported by the back-up roll support member 314. Roll pressure adjusting screws 320 are provided on the corresponding arm portions 302 of both bases 304, for the purpose of adjusting the contact pressure between both pressing rolls 80 and 82. Each roll pressure adjusting screw 320 is screwed into a female screw formed in one 302 of the associated arm portions 302, 303 and extends through a hole formed between the other 303 of the associated arm portions 302, 303. A compression spring 340 acts between the head 320 of each roll pressure adjusting screw 320 and the adjusting arm 302.

The arrangement is such that, by rotating the roll pressure adjusting screws 320, it is possible to adjust the pressure exerted by the pressing rolls 80 and 82 on the superposed photosensitive material S and the image receiving sheet C to a desired level, e.g., 200 kg/cm$^2$. In addition, the back-up pressure acting on the axially mid portions of the pressing rolls 80 and 82 can be adjusted by rotating the back-up pressure adjusting screws 312, thus uniformalizing the pressure along the axes of both pressing rolls 80 and 82.

A sheet separating device 90 disposed under the transfer device 88 includes a guide member 92, a first feed roll 94, a second feed roll 96, and a separation belt 102 which is wound around the guide rolls 98 and 100 so as to be pressed only to the photosensitive material S at each side end of the first feed roll 94.

A photosensitive material disposal section 104 is disposed at one side of the separation device 90, while a fixing device 106 is disposed on the other side of the same, The disposal section 104 includes a guide member 108, a pair of feed rolls 110, 112, and a wasting box 114, and is adapted to send the photosensitive material S from the separation device 90 into a disposal box 114.

The fixing device 106 includes a guide member 120, an ultraviolet illuminating lamp 124 with a reflector 122, and a pair of feed rolls 126, 128. The fixing device 106 is adapted to irradiate the image receiving sheet C coming from the separation device 90 past the guide member 120 with ultraviolet ray for 5 seconds thereby fixing the image.

A delivery tray 130 for receiving the image receiving sheet C after the fixing is disposed downstream from the fixing device 106 so as to project from the housing 1.

The image recording apparatus of this embodiment further has a controller (not shown) to which are operatively connected the lighting lamp 8, cutter unit 23, original supporting glass plate 2, sensor 60 for sensing the leading end of the photosensitive material, and the superposing device 70.

The controller is adapted to control a series of operations which will be described hereinunder.

When the apparatus is in the preparatory stage for recording an image, the photosensitive material S is set such that its leading end is positioned in the vicinity of the cutter unit 23 or within the dark box 20.

Then, as the copy start button (not shown) is depressed, the photosensitive material extraction roll 22 operates to feed the photosensitive material S and the lighting lamp 8 lights up to illuminate the original before the leading end of the photosensitive material reaches a position 32.

When the leading end of the photosensitive material S has reached the position 32, the original supporting glass plate 2 is moved and the photosensitive material S is fed in synchronism therewith so that the image on the original is projected onto the photosensitive material thus exposing the latter. After the photosensitive material S is fed by a distance equal to the length of the original in the moving direction, the cutter device 23 operates to cut the photosensitive material S.

The photosensitive material S thus exposed and then cut is supplied to the heat developing device 40 where it is pressed by the endless belt 50 onto the heating roller 44 which is maintained at about 120° C., whereby the image formed by the exposure is developed. Then, the sensor 60 senses that the leading end of the photosensitive material S after development has passed the outlet 56.

Meanwhile, the image receiving sheet supply device 72 starts to operate in response to the depressing of the start button or, in synchronism with the start of exposure, so as to feed the image receiving sheet C until the leading end of the image receiving sheet C is brought into the nip between the pressing roll 64 and the nip roll 66.

The superposing device 70 then operates to superpose the image receiving sheet C and the photosensitive material S such that the image receiving sheet C is centralized with respect to the photosensitive material S in the widthwise direction while the leading end of the image receiving sheet C is aligned with that of the photosensitive material S or several millimeters ahead thereof. The device 70 then feed the superposed sheet members to the transfer device 88 where both sheet members are pressed to each other at a predetermined pressure, e.g., 150 kg/cm$^2$, so that the image is transferred to the image receiving sheet C.

After the transfer of the image, the photosensitive material S is separated from the image receiving sheet C by the belt 102 in the separation device 90 and is forwarded to the disposal section 104. Meanwhile, the image receiving sheet C carrying the transferred image is fed to the fixing device 106 where it is irradiated with ultraviolet rays for 5 seconds, whereby the image is fixed. The image receiving sheet C is then sent to the delivery tray 130 by the feed rollers 126 and 128.

The lighting lamp 8 with reflecting mirror may be of any type capable of emitting radiation rays including visible rays. For instance, a strobescopic tube, a flash lamp, a tungsten lamp, a mercury lamp, a halogen lamp such as an iodine lamp, a xenon lamp, a laser light source, a CRT light source, a plasma light source, a fluorescent lamp or a light-emitting diode can be used as the lighting lamp 8. It is also possible to use a combination of a micro-shutter array making use of an LCD (Liquid Crystal Diode) or a PLZT (lead zirconium titanate doped with lanthanum) and a linear light source or a planar light source.

In the described embodiment, the exposure of the photosensitive material S is effected by directly projecting the original image on the material S through the fiber lens array 10. This, however, is not exclusive and the fiber lens array 10 may be substituted by other suitable means such as a spherical lens. It is also possible to expose the photosensitive material S indirectly through an image electric signal, by making use of a CRT, FOT (Fiber Optic Tube), LCA (Liquid Crystal Array), electro-optical element array, a combination of a laser, modulator and a scanner, or a combination of an LED and a scanner. In such a case, it is possible to effect on the image signal various editorial processings such as gradation correction, color correction and magnification or contraction of the projected image.

In the described embodiment, the scanning of the original image is conducted by moving both the original and the photosensitive material, while stationing the optical system. This, however, is not exclusive and the scanning may be effected by moving either one of the original and the photosensitive material and the optical system.

The heating roll 44 in the heat developing device 40 also is not exclusive, and may be substituted by suitable other heating device such as a heating belt, a thermal head having an array of a heat-generating element, electric heating, or a device for applying a microwave or infrared rays. When the photosensitive material S is a specific one, the heating may be effected by eddy current which is generated by electromagnetic induction. It is even possible to use a heating bath of a liquid which is inactive to the photosensitive material, e.g., a fluoro-liquid, as the means for heating. In these cases, the heating temperature generally ranges between 80° and 200° C., preferably between 100° and 160° C.

The arrangement also may be such that the image receiving sheet is superposed to the photosensitive material S before the development and the development is effected on the photosensitive material S with the image receiving sheet C superposed thereon, followed by the pressure-transfer of the developed image, although in the described embodiment the image receiving sheet C is superposed to the photosensitive material S after the development.

Figure 4:
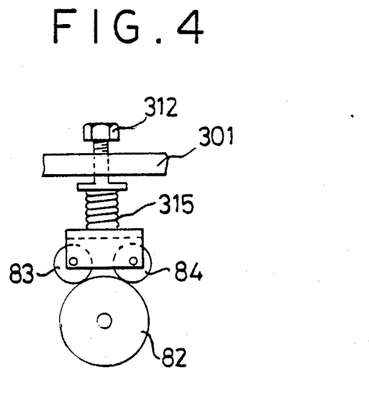
FIG. 4 is an enlarged illustration of a pressurizing mechanism employing a pair of back-up rolls.

It is to be understood also that the arrangement may be such that two back-up rolls 83 and 84 are pressed onto a single pressing roll 82 as shown in FIG. 4 or three or more back-up rolls are employed.

As will be understood from the foregoing description, according to the first embodiment of the invention, it is possible to transfer the image from the photosensitive material to the image receiving sheet by a compact transfer device which is capable of adjusting the pressure to be exerted during the transfer and uniformalizing the transfer pressure along the axes of the transfer pressing rolls. Namely, the pressing rolls can press the photosensitive material and the image receiving sheet uniformly with the desired pressure over the entire area to be pressed, regardless of any change in the thickness and/or width of the photosensitive material and the image receiving sheet, thus eliminating problems such as distortion of the transferred image and wrinkling of the image receiving sheet carrying the image.

In some cases, the processings such as exposure and development may not be conducted uniformly in the widthwise direction. In such a case, the lack of uniformity can be eliminated by developing such a pressure distribution in the transfer device such as to compensate for the unevenness of the processing in the widthwise direction.

An image recording apparatus in accordance with the second embodiment will be described hereinunder.

Figure 5:
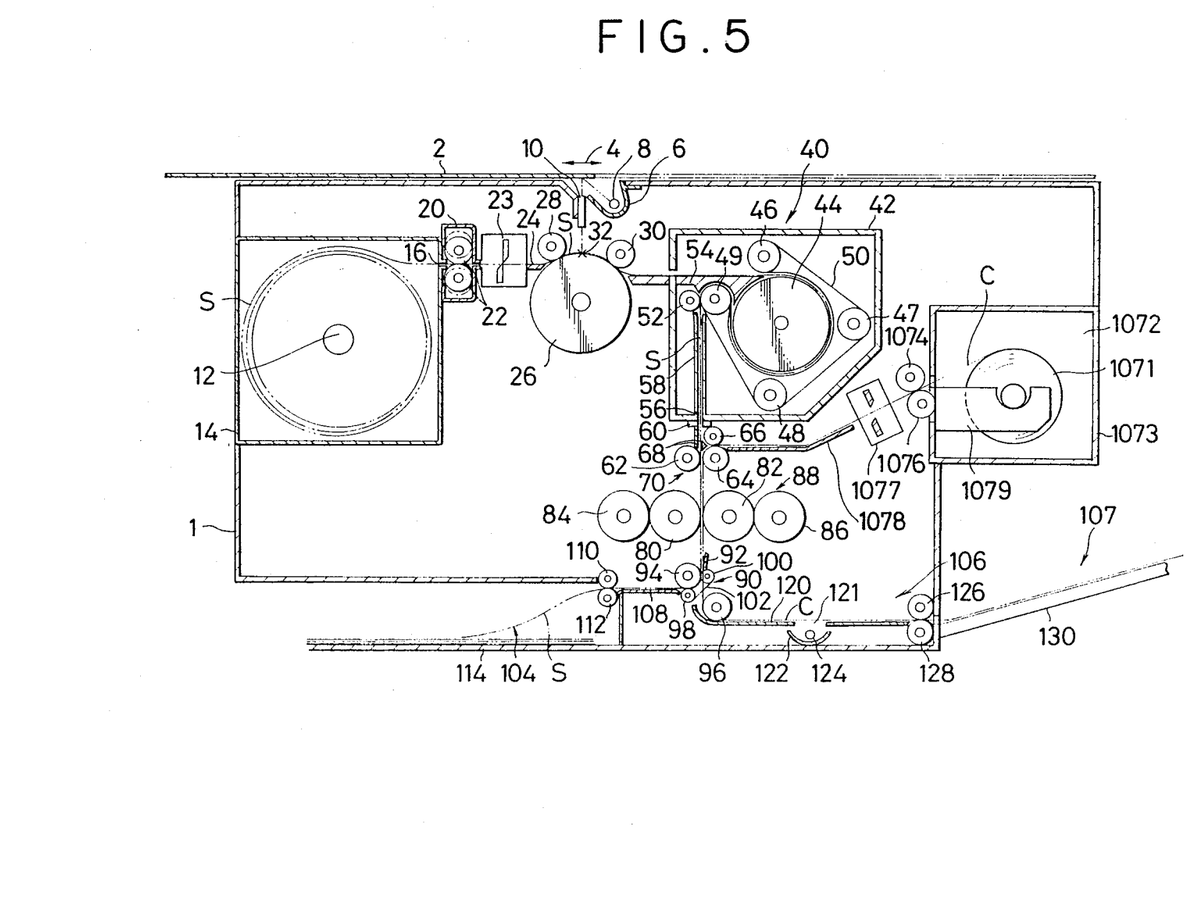
FIG. 5 is an illustration of an image recording device in accordance with the second embodiment of the present invention.

As shown in section in FIG. 5, the apparatus of the second embodiment is basically the same as the first embodiment, so that the description will be focused mainly on the points which discriminate the second embodiment from the first embodiment. Thus, in FIG. 5, the same reference numerals are used to denote the same parts or members as those in the first embodiment, and the detailed description of such parts or members is omitted to avoid duplication of description.

As shown in FIG. 5, the apparatus of the second embodiment has an image receiving sheet supply device 1072 which is disposed at one side of the superposing device 70. The image receiving sheet supply device 1072 has a cartridge 1073 detachably secured to the housing 1 and having a support 1079 which rotatably supports a roll 1071 of the image receiving sheet. The cartridge 1073 thus secured has a pair of extraction rollers 1074, 1076, a cutter unit 1077 and a guide plate 1078.

In operation, the image receiving sheet supply device 1072 operates to supply the image receiving sheet C from the image receiving sheet roll 1071 in the cartridge 1073, in response to the depressing of the start button or in synchronism with the start of the exposure. The feed of the image receiving sheet is stopped when the leading end thereof has been brought to a position where it is nipped by the pressing roller 64 and the nip roller 66.

Figure 6:
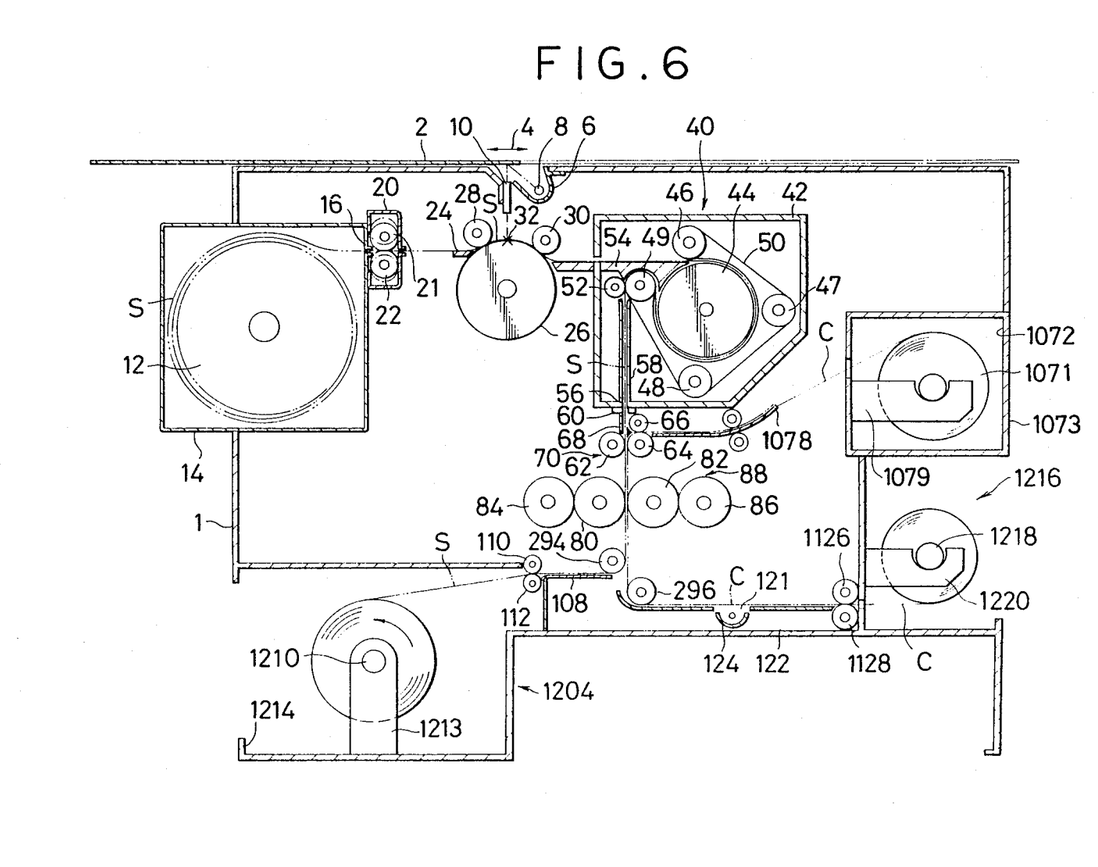
FIG. 6 is an illustration of an image recording device in accordance with the third embodiment of the present invention.

FIG. 6 shows a third embodiment of the present invention. In this Figure, the same reference numerals are used to denote the same parts or members as those used in Fig. 5 showing the second embodiment. The detailed description of such parts or members is omitted to avoid duplication of explanation. This third embodiment is discriminated from the second embodiment in that the photosensitive material S and the image receiving material C, after their use, are taken-up into rolls. Thus, the third embodiment is devoid of the cutter unit 23 for cutting the photosensitive material S, extraction rollers 1074, 1076 and the cutter unit 1077 for the image receiving sheet C, and the sheet separation device 90 all of which are employed in the second embodiment. In addition, the superposing device 70 merely functions to superpose both sheet materials, without locating them with respect to each other. In this third embodiment, guide rollers 294 and 296 are disposed in the position which is occupied by the separation device 90 in the second embodiment. Similarly, the disposal section 1104 in the second embodiment is substituted by a roll-type disposal section 1204. The roll-type disposal section 1204 has a photosensitive material take-up roller 1210 rotatably supported by a support 1213 downstream of feed rollers 110, 112. On the other hand, the delivery tray 130 in the second embodiment is substituted by a roll-type delivery device 1216. This device 1216 has an image receiving sheet take-up roller 1218 rotatably carried by arm members 1220 downstream from the feed rollers 126 and 128. The photosensitive material take-up roller 1210 and the image receiving material take-up roller 1218 are rotationally urged by the respective driving devices (not shown) in the direction for taking up the respective sheet materials.

In a modification, the cutter unit 23 is provided such as in the second embodiment, and the disposal device 104 is substituted by the roll-type disposal device 1204 in the second embodiment.

In another modification, the cutter unit 1077 is omitted from the second embodiment, and the roll-type image-receiving sheet delivery device 1216 is substituted for the image-receiving sheet delivery device.

Although the second and third embodiments described hereinbefore employ heat-developing devices, such heat developing devices are omitted when these embodiment make use of photosensitive material which does not require development by heating.

As will be understood from the foregoing description, according to the second and third embodiments of the present invention, it is possible to obtain an image recording apparatus in which the photosensitive material and the image receiving material are supplied in the form of rolls so that the portions accommodating these materials do not project from the body of the apparatus, thus realizing a compact construction of the apparatus as a whole.

Furthermore, the second and the third embodiments ensure economical use of the photosensitive and image receiving materials because they are fed from rolls and used with or without cutting as desired, thus coping with demands for recording of different sizes of image.

In addition, the risk for the photosensitive material and the image receiving material to be jammed in the apparatus is minimized. In particular, such a risk is eliminated almost completely when the photosensitive material and the image receiving material are rolled on power-driven rollers at their outlet sides.

A fourth embodiment of the present invention will be described with reference to FIG. 7. This fourth embodiment is basically the same as the preceding embodiments so that the description will be focused mainly on the points of difference.

Figure 7:
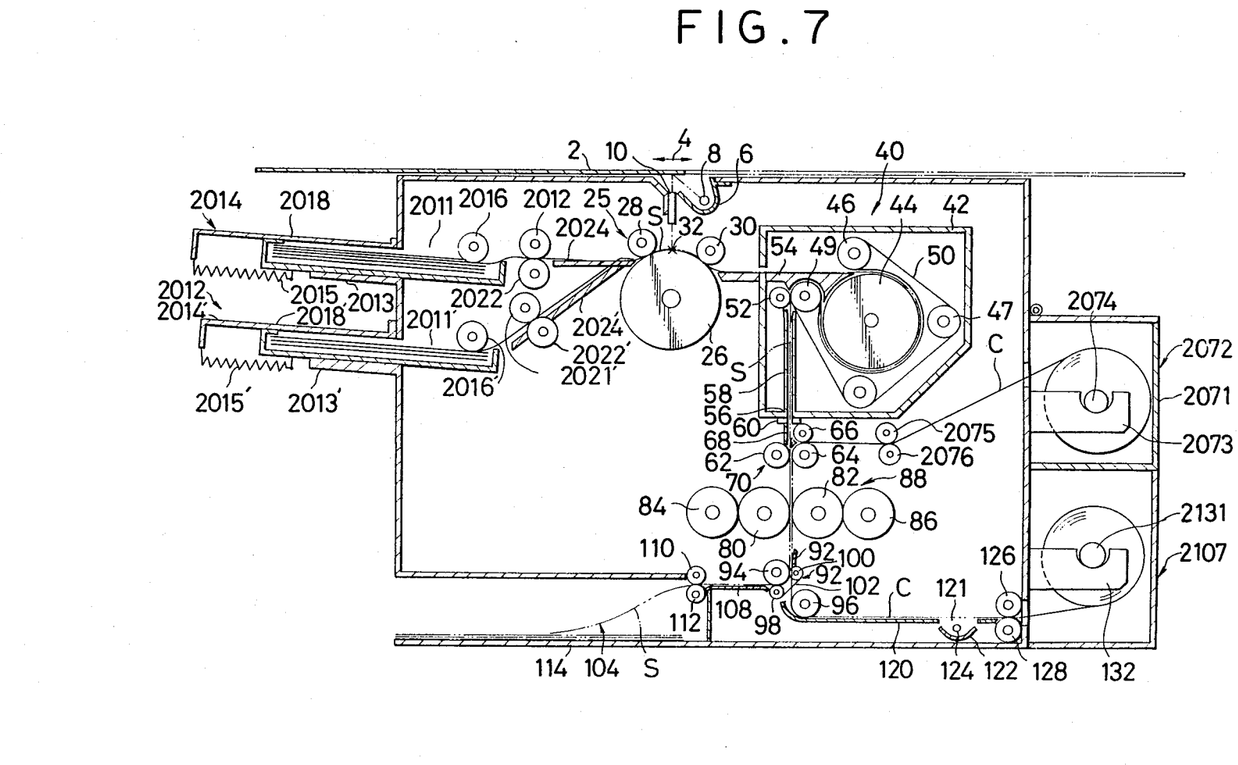
FIG. 7 is an illustration of an image recording device in accordance with the fourth embodiment of the present invention.

As will be seen from FIG. 7, the image recording apparatus of the fourth embodiment has a photosensitive material supplying device 2012 disposed on one side of the housing 1. The photosensitive material supply device 2012 detachably holds a plurality of cassettes 2014, 2014' in each of which are stacked sheets of photosensitive material S. The cassettes 2014, 2014' have box-like casings 2013, 2013' having upper openings 2011, 2011' which are closed by light-shielding lid members 2015, 2015' urged by tension springs 2015, 2015' in the closing direction, i.e., to the left as viewed in Fig. 7. As will be seen from FIG. 7, the lid members 2018, 2018' are adapted to be displaced on the casings 2013, 2013' as the cassettes 2014, 2014' are set on the housing 1, so that the upper openings are opened to enable the photosensitive material to be fed therethrough.

Material supply rollers 2016, 2016' are disposed on the material outlet side of the photosensitive material cassettes 2014, 2014'. Pairs of material feed rollers 2021, 2022; 2021', 2022' and guide plates 2024, 2024' are disposed downstream from the supply rollers 2016, 2016'. These rollers and the guide plates selectively operate so that the sheets photosensitive material S are fed one by one from the selected one of the cassettes 2014, 2014' to the exposure section 25 which is provided downstream of the guide plates 2024, 2024'.

An image receiving material supply device 2072, disposed on one side of the superposing device 70, has a housing 2071 in which is disposed a roll 2074 of the image receiving material rotatably carried by an arm member 2073. The image receiving material is unrolled from the roll 2074 and fed by a pair of supply rollers 2075 and 2076 disposed in the housing 1.

An image receiving material delivery section 2107 disposed downstream from the fixing device 121 has an image receiving material take-up roller 2131 rotatably supported by an arm member 132 in a housing 130.

In operation, the photosensitive material cassettes 2014 and 2014' are loaded with photosensitive materials of desired sensitivity levels and sizes. As a start button is pressed, the supply rollers 2016, 2016' and the pairs of the feed rollers 2021, 2022; 2021', 2022' are selectively operated to supply the photosensitive material S.

Figure 8:
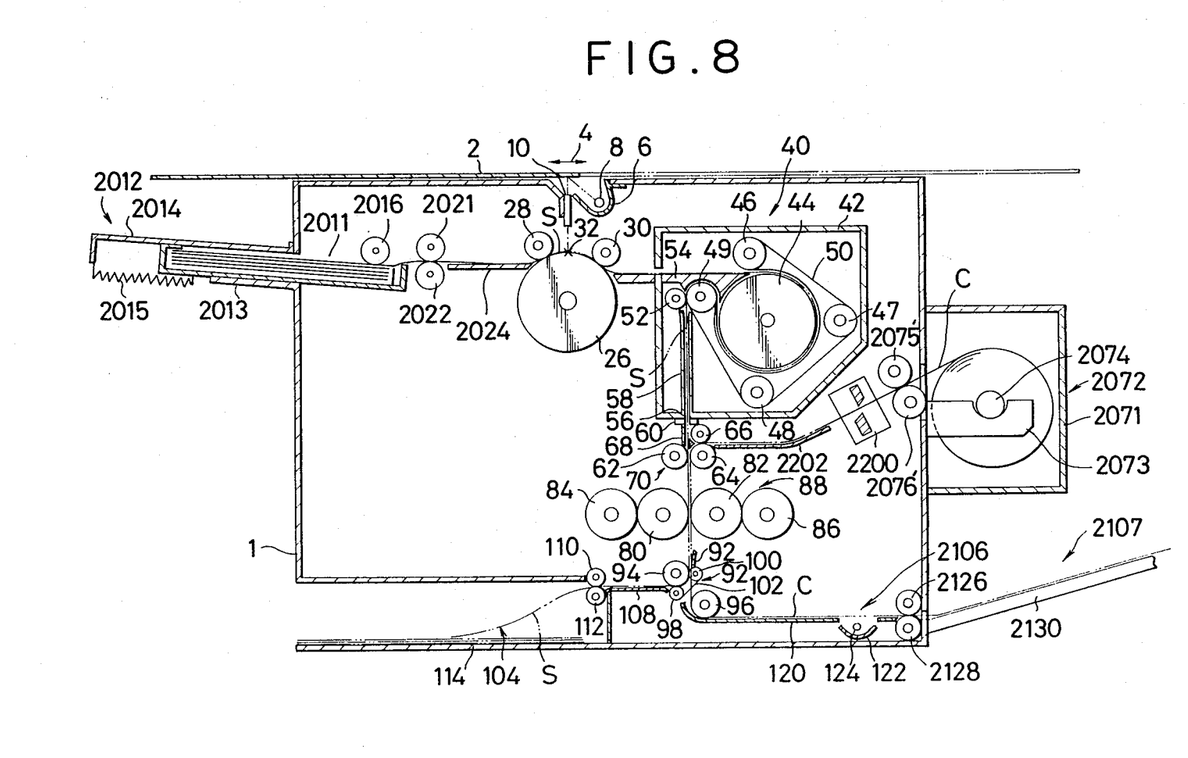
FIG. 8 is an illustration of an image recording device in accordance with the fifth embodiment of the present invention.

FIG. 8 shows a fifth embodiment of the present invention which is similar to the fourth embodiment. In Fig. 8, therefore, the same reference numerals are used to denote the same parts or members as those used in the fourth embodiment, and detailed description of such parts or members is omitted. More specifically, the fifth embodiment is distinguished from the fourth embodiment in that it employs only one photosensitive material cassette 2014 and in that the image receiving material C is delivered in the form of separate sheets. To this end, in the fifth embodiment of the present invention, the image receiving material supply device 2072 employs a cutter unit 2200 and a guide plate 2202 disposed downstream from the supply rollers 2075', 2076'. The image receiving material delivery device 2107 employs a tray 130 which is detachably mounted on the housing 1.

Although in the fifth embodiment shown in FIG. 8 the cutter unit 200 is disposed downstream from the supply rollers 2075', 2076', this is not exclusive and the cutter 200 may be disposed between the transfer device 88 and the image receiving material delivery device 2107.

As will be seen from the foregoing description, the fourth and fifth embodiment of the invention offers the following advantages.

In these embodiments, the photosensitive material is supplied in the form of separate sheets so that any tendency of fogging which tends to appear when the photosensitive material is rolled can be effectively suppressed and the construction of the device for supplying the photosensitive material is simplified.

In addition, the photosensitive material does not exhibit any winding or rolling tendency so as to suppress occurrence of jamming and to ensure a close contact with the image receiving material, thus assuring a high prevision of transfer and, hence, a high quality of the recorded image.

It is to be noted also that the photosensitive material is interchangeable for a variety of photosensitivity levels, sizes and other conditions.

It is to be noted also that, since the image receiving material is supplied from a roll, the portions projecting from the body of the apparatus is decreased, thus allowing an easy handling of the apparatus.

Figure 9:
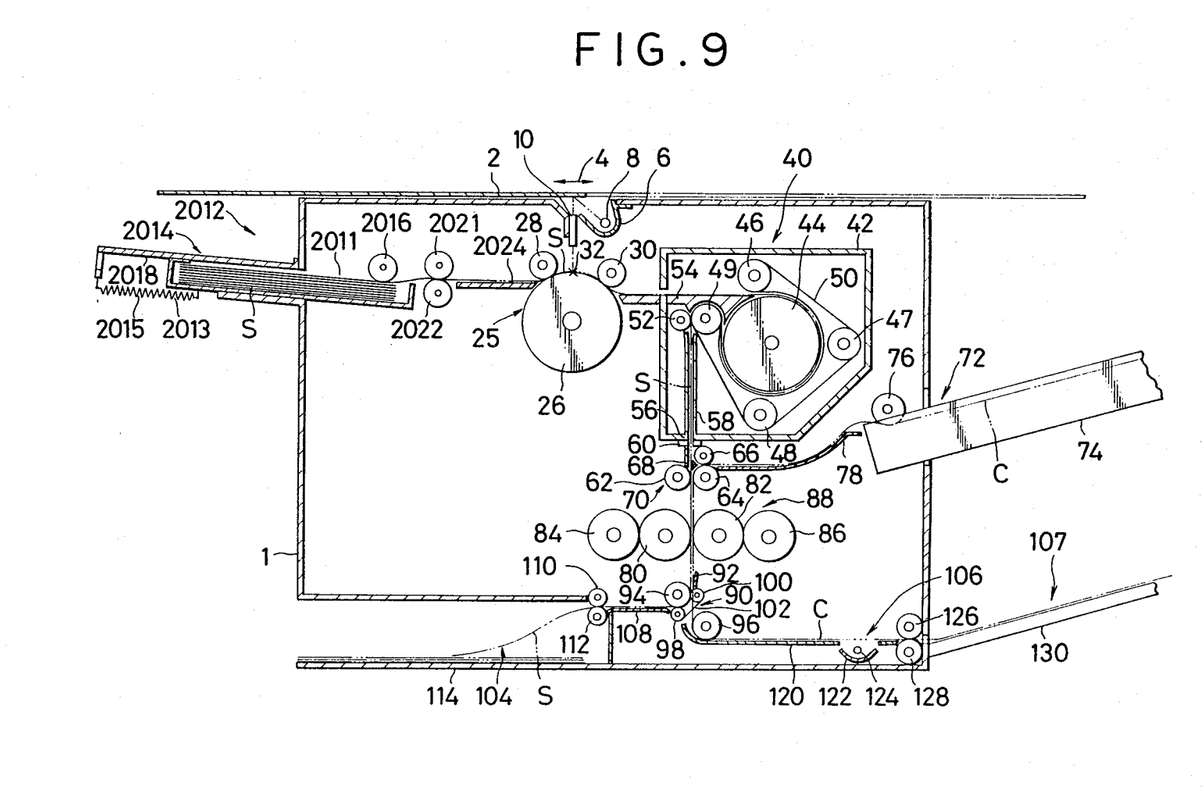
FIG. 9 is an illustration of an image recording device in accordance with the sixth embodiment of the present invention.

FIG. 9 shows a sixth embodiment of the image recording apparatus of the invention. The sixth embodiment is similar to the first embodiment except that a photosensitive material cassette 2014 capable of supplying the photosensitive material in the form of separate sheets is used in place of the roll-type supply device. Other portions are materially the same as those of the first embodiment, so that detailed description thereof is omitted. Needless to say, it is of course possible to use a plurality of photosensitive material cassettes and image receiving material cassettes such that the photosensitive materials and the image receiving materials are selectively fed by the operation of a suitable gate device or a suitable control of supply rollers.

This sixth embodiment offers the following advantages. Firstly, it will be understood that the construction of the apparatus is simplified because of elimination of the rollers for supporting the rolls of the photosensitive material and the image receiving material and the cutter units, by virtue of the fact that both the photosensitive material and the image receiving material are supplied in the form of separate sheets.

It is also to be noted that the photosensitive material and the image receiving material fed to the apparatus do not have any rolling tendency so that they are superposed in close contact with each other thus assuring a high transfer precision and, hence, high quality of the recorded image.

In addition, both the photosensitive material and the image receiving material are changeable for a variety of sensitivity levels, sizes and kinds of materials, e.g., ordinary image receiving paper or transparency sheet for overhead projectors.

Although the invention has been described through its preferred embodiments, it is to be understood that the described embodiments are only illustrative and various changes and modifications may be imparted thereto without departing from the scope of the invention which is limited solely by the appended claims.

We claim:

1. An image recording apparatus which employs a photo-and pressure-sensitive heat-developable material having a substrate and a layer formed on said substrate from a material which is photosensitive and heat-developable and which enables the developed image to be fixed by a pressure, at least part of said photosensitive and heat-developable material being contained in common microcapsules, and an image receiving material, said photosensitive material and said image receiving material being adapted to be superposed one on the other and pressed to each other so as to transfer the image from said photosensitive material to said image receiving material, said apparatus comprising:

a pair of pressing rolls for nipping said photosensitive material and said image receiving material therebetween; and means for applying a uniform contact pressure between said pair of pressing rolls; said means comprising, back-up roll means having an axial length smaller than that of said pressing rolls and adapted for acting on at least one of said pressing rolls; and back-up roll pressing means capable of independently adjusting the pressure exerted by said back-up roll means on said pressing rolls.

2. An image recording apparatus according to claim 1, wherein said pair of pressing rolls have axes parallel to each other.

3. An image recording apparatus according to claim 1, wherein said back-up roll means includes a plurality of back-up rolls.

4. An image recording apparatus according to claim 1, wherein said photosensitive material is supplied from a roll of said photosensitive material, while said image receiving material is supplied in the form of separate sheets.

5. An image recording apparatus according to claim 1, wherein said photosensitive material and said image receiving material are supplied from respective rolls of these materials.

6. An image recording apparatus according to claim 1, wherein said photosensitive material and said image receiving material are supplied in the form of separate sheets, respectively.

7. An image recording apparatus according to claim 1, wherein said photosensitive material is supplied in the form of separate sheets, while said image receiving material is supplied from a roll of such image receiving material.

8. An image recording apparatus according to claim 1, wherein said photosensitive material and said image receiving materials are supplied from rolls of the respective material.

9. An image recording apparatus according to claim 8, wherein said photosensitive material after the transfer is taken-up into the form of a roll.

10. An image recording apparatus according to claim 8, wherein said photosensitive material after the transfer is taken-up in the form of a separate sheet.

11. An image recording apparatus according to claim 8, wherein said image receiving material after the transfer is taken-up into the form of a roll.

12. An image recording apparatus according to claim 8, wherein said image receiving material after the transfer is taken-up in the form of a separate sheet.

13. An image recording apparatus according to claim 1, wherein said photosensitive material is supplied in the for of separate sheets while said image receiving materials is supplied from a roll of said image receiving material.

14. An image recording apparatus according to claim 13, wherein said photosensitive material is accommodated in a light-shielding cassette.

15. An image recording apparatus according to claim 14, wherein said light-shielding cassette has a lid member which normally closes an opening in said cassette but is displaced when said cassette is mounted on the apparatus body so as to open said opening thus enabling said photosensitive material to be supplied through said opening.

16. An image recording apparatus according to claim 13, wherein the image receiving material after the transfer of image is delivered in the form of separate sheets.

17. An image recording apparatus according to claim 1, wherein said photosensitive material and said image receiving materials are supplied, respectively, in the form of separate sheets.

18. An image recording apparatus according to claim 17, wherein said photosensitive material is accommodated in a light-shielding cassette.

19. An image recording apparatus according to claim 17, wherein said light-shielding cassette has a lid member which normally closes an opening in said cassette but is displaced when said cassette is mounted on the apparatus body so as to open said opening thus enabling said photosensitive material to be supplied through said opening

* * * * *